United States Patent
Jiang et al.

(10) Patent No.: US 9,754,636 B2
(45) Date of Patent: Sep. 5, 2017

(54) HARDWARE-ACCELERATED DYNAMIC VOLTAGE AND FREQUENCY SCALING

(71) Applicant: MediaTek Inc., Hsinchu (TW)

(72) Inventors: Tai-Ying Jiang, Hsinchu (TW); Jien-Jia Su, Zhubei (TW); Szu-Ying Cheng, Hsinchu (TW); Chun-Fang Peng, Hsinchu (TW); Fumin Huang, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 40 days.

(21) Appl. No.: 14/871,859

(22) Filed: Sep. 30, 2015

(65) Prior Publication Data

US 2016/0027480 A1    Jan. 28, 2016

Related U.S. Application Data

(60) Provisional application No. 62/058,841, filed on Oct. 2, 2014.

(51) Int. Cl.
| | |
|---|---|
| *G06F 1/26* | (2006.01) |
| *G11C 5/14* | (2006.01) |
| *G11C 29/02* | (2006.01) |
| *G11C 29/44* | (2006.01) |

(52) U.S. Cl.
CPC ............. *G11C 5/147* (2013.01); *G06F 1/26* (2013.01); *G11C 29/028* (2013.01); *G11C 29/021* (2013.01); *G11C 29/023* (2013.01); *G11C 2029/4402* (2013.01)

(58) Field of Classification Search
CPC ............. G06F 1/26; G11C 2029/4402; G11C 29/021; G11C 29/023; G11C 29/028; G11C 5/147
See application file for complete search history.

(56) References Cited

U.S. PATENT DOCUMENTS

| | | | | |
|---|---|---|---|---|
| 7,793,172 B2* | 9/2010 | Bruce | ..................... | G11C 5/147 714/708 |
| 8,473,768 B2* | 6/2013 | Kim | ........................ | G06F 1/263 713/340 |
| 2008/0091990 A1* | 4/2008 | Bruce | ..................... | G11C 5/147 714/721 |
| 2011/0119514 A1* | 5/2011 | Kim | ........................ | G06F 1/263 713/340 |
| 2014/0232333 A1* | 8/2014 | Kim | ........................ | H02J 7/025 320/108 |
| 2015/0058646 A1* | 2/2015 | Kim | ...................... | G06F 1/3206 713/320 |

* cited by examiner

*Primary Examiner* — Abdelmoniem Elamin
(74) *Attorney, Agent, or Firm* — Han IP Corporation; Andy M. Han

(57) ABSTRACT

One or more values associated with a first configuration setting for a first circuit may be stored in a first set of one or more registers when an operation of the first circuit is based at least in part on one or more values associated with a second configuration setting stored in a second set of one or more registers. In response to receiving an indication of a change in an operating frequency or voltage of the first circuit, the one or more values stored in the second set of one or more registers may be changed by loading the one or more values associated with the first configuration setting stored in the first set of one or more registers into the second set of one or more registers in a parallel fashion.

28 Claims, 6 Drawing Sheets

HARDWARE-ACCELERATED DYNAMIC VOLTAGE AND FREQUENCY SCALING

CROSS REFERENCE TO RELATED PATENT APPLICATION

The present disclosure claims the priority benefit of U.S. Provisional Patent Application Ser. No. 62/058,841, filed on Oct. 2, 2014, which is incorporated by reference in its entirety.

TECHNICAL FIELD

The present disclosure is generally related to voltage and frequency scaling and, more particularly, to hardware-accelerated dynamic voltage and frequency scaling.

BACKGROUND

Unless otherwise indicated herein, approaches described in this section are not prior art to the claims listed below and are not admitted to be prior art by inclusion in this section.

Portable electronic apparatuses such as smartphones and tablet computers are typically equipped with multiple functions and features. Often times the multiple functions and features are implemented in the form of a main integrated circuit (IC) chip and one or more external components coupled to the main IC chip, where each of the external components may respectively operate on one or more multiple voltages and/or at one of multiple clock rates, depending on the respective configuration setting. That is, multiple clocks are provided in a portable electronic apparatus for the operations of the multiple external components to provide the multiple functions and features.

Dynamic voltage and frequency scaling (DVFS) is a power management technique in computer architecture for adjustment of operating voltage and/or frequency, or clock rate, of an electronics component such as an IC chip. In a portable electronic apparatus with a main IC chip and one or more external components coupled thereto, each of which respectively operating at one or more voltages and/or one or more frequencies, there is a need for coordination in changes made for DVFS adjustment between the main IC chip and the one or more external components. Moreover, changes in operating voltage and/or frequency may be triggered by software commands and/or hardware signals. However, with frequent changes in operating voltage and/or frequency and configuration setting, e.g., by hardware signals, there tends to be a loss in efficiency.

SUMMARY

The following summary is illustrative only and is not intended to be limiting in any way. That is, the following summary is provided to introduce concepts, highlights, benefits and advantages of the novel and non-obvious techniques described herein. Select, not all, implementations are further described below in the detailed description. Thus, the following summary is not intended to identify essential features of the claimed subject matter, nor is it intended for use in determining the scope of the claimed subject matter.

In one example implementation, a method may involve storing one or more values associated with a first configuration setting for a first circuit in a first set of one or more registers when an operation of the first circuit is based at least in part on one or more values associated with a second configuration setting stored in a second set of one or more registers. The first and second configuration settings may correspond to a first set of one or more operational parameters and a second set of one or more operational parameters of the first circuit, respectively. The method may also involve receiving an indication of a change in an operating frequency or voltage of the first circuit. The method may further involve, in response to receiving the indication of the change in the operating frequency or voltage of the first circuit, changing the one or more values stored in the second set of one or more registers by loading the one or more values associated with the first configuration setting stored into the first set of one or more registers to the second set of one or more registers in a parallel fashion.

In another example implementation, an apparatus may include a first set of one or more registers, a second set of one or more registers, a first circuit coupled to the first set of one or more registers and the second set of one or more registers, and a hardware setting change accelerator which may be coupled to or capable of accessing the first set of one or more registers and the second set of one or more registers. The first circuit may be configured to operate based at least in part on one or more values corresponding to a first configuration setting when an operating frequency or voltage of the first circuit is set to a first value. The first circuit may be further configured to operate based at least in part on one or more values corresponding to a second configuration setting when the operating frequency or voltage of the first circuit operates is set to a second value. The hardware setting change accelerator may be configured to store one or more values associated with the first configuration setting for the first circuit in the first set of one or more registers when an operation of the first circuit is based at least in part on one or more values associated with a second configuration setting stored in the second set of one or more registers. The hardware setting change accelerator may be also configured to receive an indication that the operating frequency or voltage of the first circuit is to change from the second value to the first value. The hardware setting change accelerator may be further configured to, in response to receiving the indication that the operating frequency of the first circuit is to change from the second value to the first value, change the one or more values stored in the second set of one or more registers by loading the one or more values associated with the first configuration setting stored in the first set of one or more registers into the second set of one or more registers in a parallel fashion.

Advantageously, implementations in accordance with the present disclosure may expeditiously adjust or otherwise change a respective configuration setting of a circuit in response to a change in a respective operating frequency and/or operating voltage thereof, where the circuit may, at a given time, operate under one of multiple possible operating frequencies/voltages each of which corresponding to a respective configuration setting for the circuit. Also advantageously, the use of a hardware setting change accelerator, which may be implemented in software, hardware or a combination thereof, may minimize loss in efficiency as with conventional approaches. In contrast, in conventional approaches, values of one or more configuration settings are usually generated or otherwise stored in software codes and loaded serially into respective register(s) to effect a change in configuration setting in response to a change in the operating frequency and/or operating voltage.

BRIEF DESCRIPTION OF THE DRAWINGS

The accompanying drawings are included to provide a further understanding of the disclosure, and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION

Overview

Figure 1:
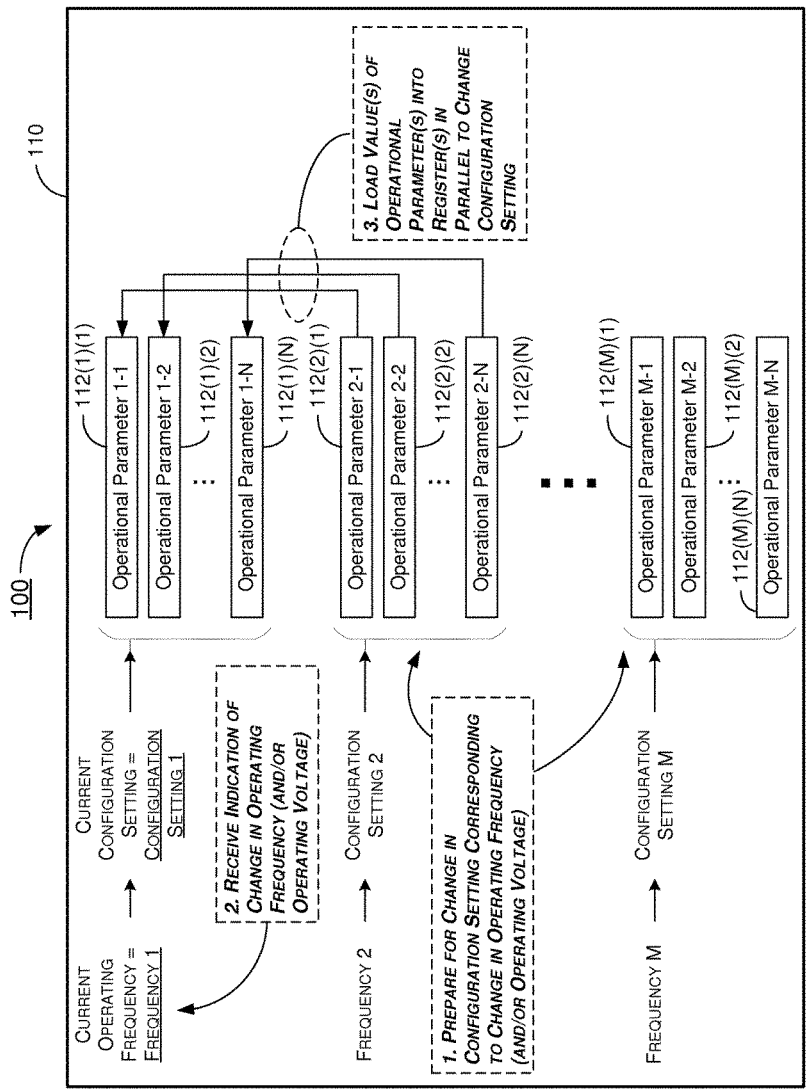
FIG. 1 is a block diagram of an example scheme in accordance with an implementation of the present disclosure.

FIG. 1 illustrates an example scheme 100 in accordance with an implementation of the present disclosure. Example scheme 100 may be implemented in a variety of applications including IC applications such as, for example and not limited to, central processing unit (CPUs), graphics processing unit (GPUs), controller IC, application-specific IC (ASIC) and system-on-a-chip (SOC) applications. Example scheme 100 may be implemented in a variety of forms such as, for example and not limited to, single-chip form and multi-chip form. That is, various functional areas and physical components of example scheme 100 may be implemented in a single IC chip or in multiple IC chips.

Referring to FIG. 1, example scheme 100 may pertain to a device 110 which may be implemented in the form of a circuit including, for example and not limited to, one or more transistors, one or more capacitors, one or more diodes, one or more resistors, one or more inductors and/or one or more memristors. Device 110 may be configured to operate at multiple operating frequencies (or clock rates) and voltages, e.g., depending on system requirement and/or loading. In the example shown in FIG. 1, device 110 may be configured to operate, at a given time during operation, at one of frequency 1, frequency 2 . . . and frequency M, where M is a positive integer greater than 1. Each of the possible operating frequencies and/or operating voltages of device 110 may correspond to a respective configuration setting of multiple configuration settings under which device 110 may possibly operate. That is, at a given time during operation, e.g., when powered on, device 110 may operate at an operating frequency and/or an operating voltage which corresponds to one of multiple possible configuration settings of device 110. In the example shown in FIG. 1, device 110 may be configured to operate, at a given time during operation, under one of configuration setting 1, configuration setting 2 . . . and configuration setting M. Each configuration setting of device 110 may be defined by or otherwise associated with one or more operational parameters under which device 110 may operate. Each of the one or more operational parameters associated with each configuration setting of device 110 may include, for example and not limited to, a frequency or a voltage of device 110.

As an example for illustrative purpose, in the context that the configuration setting of device 110 changes whenever the operating frequency (or clock rate) of device 110 changes, the configuration of device 110 may be set to a first configuration setting when the operating frequency is at a first value (e.g., 180 MHz), the configuration of device 110 may be set to a second configuration setting when the operating frequency is at a second value (e.g., 250 MHz), the configuration of device 110 may be set to a third configuration setting when the operating frequency is at a third value (e.g., 300 MHz), and so on. That is, whichever configuration setting is in effect may depend on the current value of the operating frequency in this example. Put differently, whenever there is a change in the value of the operating frequency and/or operating voltage of device 110, the configuration setting of device 110 may need to be adjusted or otherwise changed accordingly.

Device 110 may include multiple sets of registers, including a first set of registers 112(1)(1)-112(1)(N) . . . up to an $M^{th}$ set of registers 112(M)(1)-112(M)(N) with each set having a quantity of N registers, where N is a positive integer greater than or equal to 1. Each register of one or more registers of each set of the multiple sets of registers 112(1)(1)-112(1)(N) through 112(M)(1)-112(M)(N) may respectively store a value of a respective operational parameter associated with a respective configuration setting of device 110, which may be an operational parameter currently-in-use, an operational parameter to be used next or sometime in the future and/or an operational parameter used in the past with respect to device 110. In other words, each set of the multiple sets of registers 112(1)(1)-112(1)(N) through 112(M)(1)-112(M)(N) may respectively store one or more values of a set of one or more operational parameters associated with a respective configuration setting of device 110 corresponding to a respective operating frequency and/or operating voltage of multiple possible frequencies and/or voltages at which device 110 may operate. In the example shown in FIG. 1, a first set of registers 112(1)(1)-112(1)(N) may store value(s) of operational parameter 1-1, operational parameter 1-2 . . . and operational parameter 1-N, a second set of registers 112(2)(1)-112(2)(N) may store value(s) of operational parameter 2-1, operational parameter 2-2 . . . and operational parameter 2-N, and so on, up to an $M^{th}$ set of registers 112(M)(1)-112(M)(N) which may store value(s) of operational parameter M-1, operational parameter M-2 . . . and operational parameter M-N.

In example scheme 100, one set of registers, for example, first set of registers 112(1)(1)-112(1)(N) may be a designated set of registers to store value(s) of a set of one or more operational parameters associated with a current configuration setting of device 110 which corresponds to a current operating frequency (and/or operating voltage) of device 110 currently in effect at the time. Correspondingly, each set of the one or more other sets of registers 112(2)(1)-112(2)(N) through 112(M)(N)-112(M)(N) may store value(s) of a set of one or more operational parameters associated with a future configuration setting or a past configuration setting. The term "current configuration setting" herein refers to a configuration setting currently in effect, i.e., under which device 110 currently operates. The term "future configuration setting" herein refers to a configuration setting not currently in effect and may be in effect in the future, e.g., next time the operating frequency and/or operating voltage of device 110 changes from one value to another value. The term "past configuration setting" herein refers to a configuration setting previously in effect and not currently in effect.

In example scheme 100, whenever there is a change in the operating frequency and/or operating voltage of device 110, from a first value to a second value for example, the configuration setting of main device 110 changes correspondingly (e.g., from a first configuration setting to a second configuration setting), requiring the value(s) stored in first set of registers 112(1)(1)-112(1)(N) to be changed from value(s) of a first set of one or more operational parameters associated with the first configuration setting to value(s) of a second set of one or more operational parameters associated with the second configuration setting. Notably, value(s) associated with one or more future configuration settings to be used sometime in the future may be prepared in advance and stored in the respective register(s) early in time, even before an indication is received or otherwise a determination is made as to the need for device 110 to change its configuration from one configuration setting to another configuration setting, corresponding to a change in the operating frequency and/or operating voltage thereof. In other words, preparation for a change in the operating frequency and/or operating voltage of device 110 from one value to another value may be made in advance prior to the actual change in the operating frequency and/or operating voltage. In some implementations, preparation for a change in the operating frequency and/or operating voltage of device 110 from one value to another value may be made in advance prior to receiving an indication of a change in the operating frequency and/or operating voltage.

It is also noted that, one or more value(s) associated with one or more future configuration settings to be used sometime in the future may be prepared in advance, at the same time or at different times. In addition, the possible value(s) associated with part or all of possible configuration settings to be used sometime in the future may be prepared in advance. In addition, part or all of the possible value(s) associated with each of possible configuration settings to be used sometime in the future may be prepared in advance. In addition, the one or more future configuration settings prepared to be used sometime in the future may be constant(s) or variant(s), and/or can be fixed or modified. In other words, any preparation utilizing one or more registers can be implemented to facilitate the change of the configuration setting.

A general operation with respect to example scheme 100 is shown in FIG. 1. Referring to FIG. 1, example scheme 100 may prepare for a change in configuration setting of device 110 corresponding to a change in the operating frequency and/or operating voltage in advance and prior to such change. This may be done by storing value(s) of one or more sets of one or more operational parameters associated with one or more possible configuration settings to which the current configuration setting of device 110 may change in one or more sets of registers (e.g., second set of registers 112(2)(1)-112(2)(N) up to $M^{th}$ set of registers 112(M)(1)-112(M)(N)). Upon receiving an indication or upon a determination that the operating frequency and/or operating voltage is to change from a current value to a next value, example scheme 100 may load, in a parallel fashion in one clock cycle, value(s) of the set of one or more operational parameters associated with the next configuration setting corresponding to the next value of the operating frequency and/or operating voltage into the designated set of registers that stores value(s) of the set of one or more operational parameters based on which device 110 operates (e.g., first set of registers 112(1)(1)-112(1)(N)) from the pertinent set of registers among the second set of registers 112(2)(1)-112(2)(N) through $M^{th}$ set of registers 112(M)(1)-112(M)(N). The term "parallel" herein may mean that the value stored in register 112($i$)(1), the value stored in register 112($i$)(2), the value stored in register 112($i$)(3), . . . and the value stored in register 112($i$)(N) (where "i" is an integer and i=1~M) can be loaded into the registers 112(1)(1), 112(1)(2), 112(1)(3), . . . and 112(1)(N), respectively, at the same time.

As an example for illustrative purpose, when the operating frequency of device 110 is at a first value, the current configuration setting may be a first configuration setting and device 110 may operate under a first set of one or more operational parameters (associated with a first configuration setting), the value(s) of which stored in first set of registers 112(1)(1)-112(1)(N). Prior to receiving an indication that the operating frequency is to change from the first value to another value, example scheme 100 may at least store value(s) of a second set of one or more operational parameters associated with a second configuration setting in anticipation of the operating frequency changing from the first value to a second value which corresponds to a second configuration setting. The second configuration setting may be any other $i^{th}$ configuration setting (where "i" is an integer and i=1~M), and for convenience of explanation, is the configuration setting in second set of registers 112(2)(1)-112(2)(N).

Optionally, example scheme 100 may also store value(s) of one or more third sets of one or more operational parameters associated with one or more other different configuration settings in one or more other sets of registers, in anticipation of the operating frequency changing from the first value to a value which corresponds to any one of the other different configuration settings. For example, the other configuration setting may be an $M^{th}$ configuration setting in $M^{th}$ set of registers 112(M)(1)-112(M)(N), which can be prepared in anticipation of the operating frequency changing from the first value to an $M^{th}$ value which corresponds to an $M^{th}$ configuration setting. That is, when the operating frequency is currently at the first value and device 110 operates under the first set of one or more operational parameters associated with the first configuration setting, example scheme 100 may store value(s) of operational parameter(s) associated with the next $i^{th}$ configuration setting, which may be any configuration setting in register set 112($i$)(1)-112($i$)(N) (where i is an integer and i=2~M), i.e., from the second configuration setting in the second set of registers 112(2)(1)-112(2)(N) up to the $M^{th}$ configuration setting in the $M^{th}$ set of registers 112(M)(1)-112(M)(N)) in advance. When an indication is received or otherwise a determination is made that the operating frequency of device 110 is to change from the first value to the second value, example scheme 100 may load the value(s) of the second set of one or more operational parameters associated with the second configuration setting, stored in $i^{th}$ set of registers 112($i$)(1)-112($i$)(N) (where i is an integer and i=2~M) into first set of register 112(1)(1)-112(1)(N) in a parallel fashion in one clock cycle. Accordingly, in this example, as first set of registers 112(1)(1)-112(1)(N) is the designated set of registers that stores value(s) of the set of one or more operational parameters associated with the current configuration setting of device 110 corresponding to the current operating frequency, the configuration setting of device 110 is effectively changed from the first configuration setting to the second configuration setting upon value(s) of the second set of one or more operational parameters associated with the second configuration setting being loaded into first set of registers 112(1)(1)-112(1)(N). In some implementations, example scheme 100 may load the one or more values associated with the next i$^{th}$ configuration setting into i$^{th}$ set of registers 112(i)(1)-112(i)(N) (where i is an integer and i=2~M) prior to the operation of device 110 is based at least in part on the one or more values associated with the first configuration setting stored in first set of registers 112(1)(1)-112(1)(N). Alternatively, example scheme 100 may load the one or more values associated with the next i$^{th}$ configuration setting into the i$^{th}$ set of registers 112(i)(1)-112(i)(N) after the operation of device 110 is based at least in part on the one or more values associated with the first configuration setting stored in the first set of registers 112(1)(1)-112(1)(N) and prior to receiving the indication or prior to the determination that the operating frequency or voltage of device 110 is to change.

Figure 2:
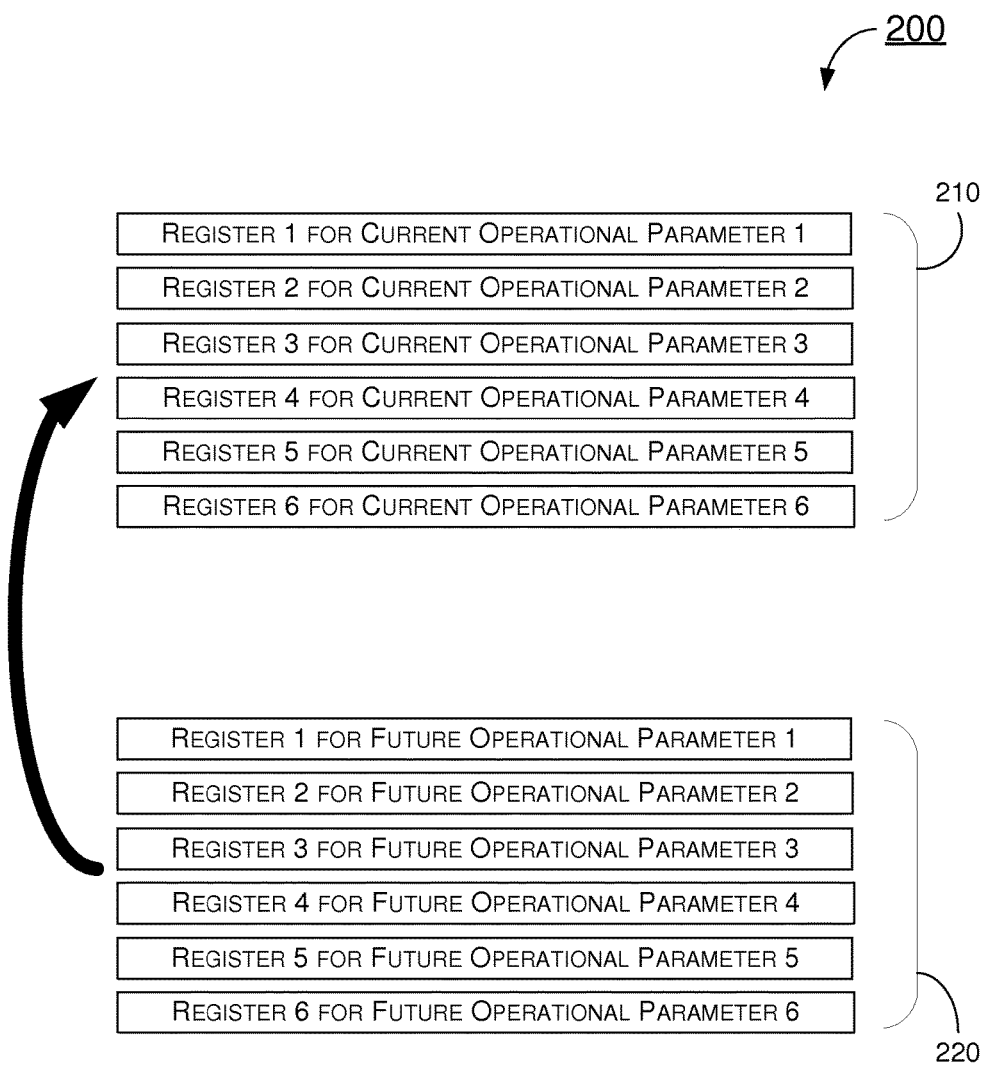
FIG. 2 is a diagram of an example scenario in accordance with an implementation of the present disclosure.

FIG. 2 illustrates an example scenario 200 depicting a swapping operation with respect to example scheme 100 in accordance with an implementation of the present disclosure. Referring to FIG. 2, a first set 210 of registers may be a designated set of registers that stores values of a set of operational parameters associated with a current configuration setting of device 110 corresponding to the current operating frequency and/or future operating voltage of device 110. A second set 220 of registers may be a set of registers that stores values of a set of operational parameters associated with a future configuration setting of device 110 corresponding to a future operating frequency and/or future operating voltage of device 110. The second set 220 of registers may be any set of registers other than the first set of registers. Thus, first set 210 of registers may be similar or analogous to first set of registers 112(1)(1)-112(1)(N), and second set 220 of registers may be similar or analogous to any of second set of registers 112(2)(1)-112(2)(N) through M$^{th}$ set of registers 112(M)(1)-112(M)(N) in the example described above with respect to FIG. 1.

In the example shown in FIG. 2, in first set 210 of registers, a register 1 may store the value of operational parameter 1 currently in effect, a register 2 may store the value of operational parameter 2 currently in effect, a register 3 may store the value of operational parameter 3 currently in effect, a register 4 may store the value of operational parameter 4 currently in effect, a register 5 may store the value of operational parameter 5 currently in effect, and a register 6 may store the value of operational parameter 6 currently in effect. That is, first set 210 of registers may store values of operational parameters 1-6 associated with the current configuration setting corresponding to the current operating frequency and/or operating voltage of device 110. In second set 220 of registers, a register 1 may store the value of operational parameter 1 to be in effect in the future, a register 2 may store the value of operational parameter 2 to be in effect in the future, a register 3 may store the value of operational parameter 3 to be in effect in the future, a register 4 may store the value of operational parameter 4 to be in effect in the future, a register 5 may store the value of operational parameter 5 to be in effect in the future, and a register 6 may store the value of operational parameter 6 to be in effect in the future.

Upon receiving an indication or upon a determination that the operating frequency and/or operating voltage of device 110 is to change, the values stored in first set 310 of registers and the values stored in second set 320 of registers may be swapped in that the values stored in second set 220 of registers are loaded into first set 210 of registers in a parallel fashion (and result in overwriting of the values previously stored in first set 210 of registers). Advantageously, this swapping operation may be performed in a single clock cycle.

Figure 3:
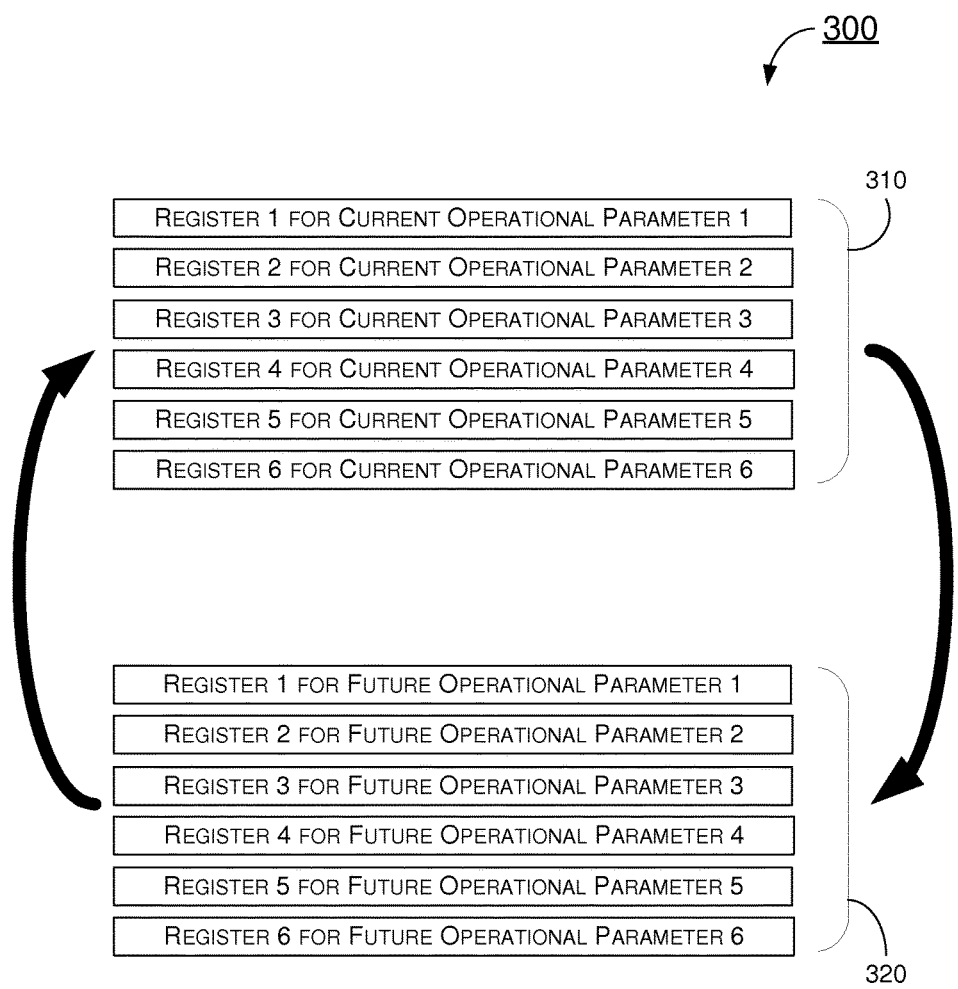
FIG. 3 is a diagram of an example scenario in accordance with another implementation of the present disclosure.

FIG. 3 illustrates an example scenario 300 depicting a shuffling operation with respect to example scheme 100 in accordance with another implementation of the present disclosure. Referring to FIG. 3, a first set 310 of registers may be a designated set of registers that stores values of a set of operational parameters associated with a current configuration setting of device 110 corresponding to the current operating frequency and/or future operating voltage of device 110. A second set 320 of registers may be a set of registers that stores values of a set of operational parameters associated with a future configuration setting of device 110 corresponding to a future operating frequency and/or future operating voltage of device 110. Thus, first set 310 of registers may be similar or analogous to first set of registers 112(1)(1)-112(1)(N), and second set 320 of registers may be similar or analogous to any of second set of registers 112(2)(1)-112(2)(N) through M$^{th}$ set of registers 112(M)(1)-112(M)(N) in the example described above with respect to FIG. 1.

In the example shown in FIG. 2, in first set 310 of registers, a register 1 may store the value of operational parameter 1 currently in effect, a register 2 may store the value of operational parameter 2 currently in effect, a register 3 may store the value of operational parameter 3 currently in effect, a register 4 may store the value of operational parameter 4 currently in effect, a register 5 may store the value of operational parameter 5 currently in effect, and a register 6 may store the value of operational parameter 6 currently in effect. That is, first set 310 of registers may store values of operational parameters 1-6 associated with the current configuration setting corresponding to the current operating frequency and/or operating voltage of device 110. In second set 320 of registers, a register 1 may store the value of operational parameter 1 to be in effect in the future, a register 2 may store the value of operational parameter 2 to be in effect in the future, a register 3 may store the value of operational parameter 3 to be in effect in the future, a register 4 may store the value of operational parameter 4 to be in effect in the future, a register 5 may store the value of operational parameter 5 to be in effect in the future, and a register 6 may store the value of operational parameter 6 to be in effect in the future.

Upon receiving an indication or upon a determination that the operating frequency and/or operating voltage of device 110 is to change, the values stored in first set 310 of registers and the values stored in second set 320 of registers may be shuffled in that the values stored in second set 320 of registers are loaded into first set 310 of registers in a parallel fashion and the values stored in first set 310 of registers are loaded into second set 320 of registers in a parallel fashion. As a result, after the shuffling operation, first set 310 of registers may be loaded with values previously stored in second set 320 of registers, and second set 320 of registers may be loaded with values previously stored in first set 310 of registers. In other words, after the shuffling operation, second set 320 of registers may store values of operational parameters associated with a past configuration setting previously in effect but not currently in effect. Advantageously, this shuffling operation may be performed in a single clock cycle.

Example Implementations

Figure 4:
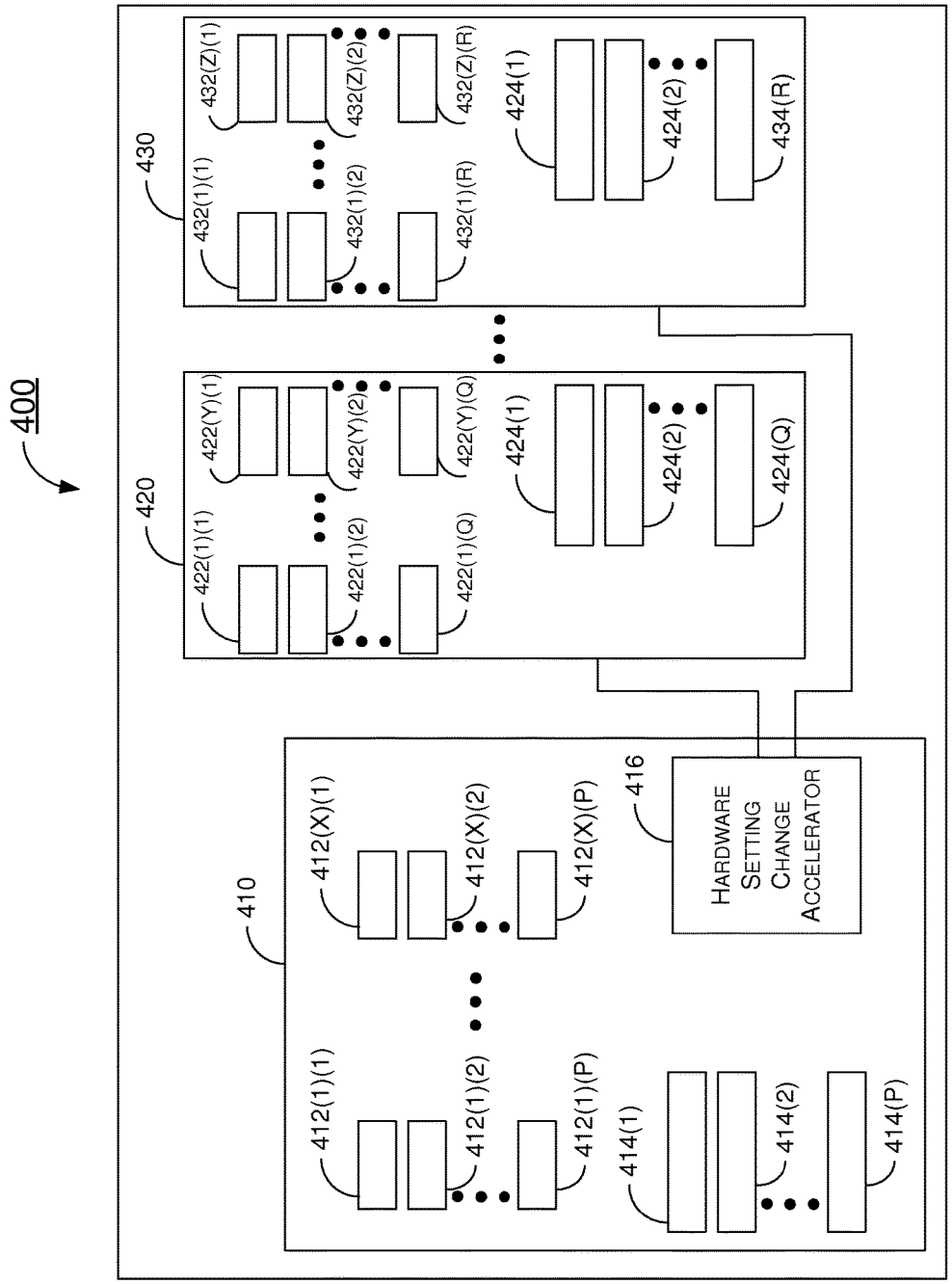
FIG. 4 is a block diagram of an example apparatus in accordance with an implementations of the present disclosure.

FIG. 4 illustrates an example apparatus 400 in accordance with an implementations of the present disclosure. Example apparatus 400 may perform various functions related to techniques, methods and systems described herein, including example scheme 100 described above and example process 600 described below. Example apparatus 400 may be an illustrative implementation of example scheme 100.

Example apparatus 400 may include a number of hardware components. Each hardware component may be form of one or more electronic circuits each respectively including physical elements such as one or more transistors, one or more capacitors, one or more diodes, one or more resistors, one or more inductors and/or one or more memristors. Moreover, one or more of the hardware components of example apparatus 400 may be configured to execute one or more sets of instructions stored in the form of one or more firmware modules, one or more middleware modules and/or one or more software modules. In some implementations, the one or more firmware modules, one or more middleware modules and/or one or more software modules may be embedded or otherwise stored in one or more of the hardware components of example apparatus 400. Additionally or alternatively, the one or more firmware modules, one or more middleware modules and/or one or more software modules may be stored in one or more external memory or data storage devices. Example apparatus 400 may be an IC chip, a chip set or an electronic apparatus. In some implementations, example apparatus 400 may be a portable electronics apparatus such as, for example and not limited to, a smartphone, a tablet computer, a laptop computer, a notebook computer, a wearable device and the like.

Example apparatus 400 may include at least those components shown in FIG. 4, such as a main device 410 and one or more external components 420 and 430. Although two external components are shown in FIG. 4 (e.g., external component 420 and external component 430), the quantity of external components may be different (e.g., less or greater) in various implementations. In some implementations, main device 410 may be a processor chip, and at least one of external components 420 and 430 may be a memory chip such as, for example, a type of a dynamic random access memory (DRAM), a static random access memory (SRAM) or a flash memory.

Main device 410 may include a first set of registers 414(1)-414(P) and one or more sets of registers 412(1)(1)-412(1)(P) . . . up to an $X^{th}$ set of registers 412(X)(1)-412(X)(P) with each set having a quantity of P registers, where X is a positive integer greater than 1 and P is a positive integer greater than or equal to 1. First set of registers 414(1)-414(P) may be a designated set of registers that stores value(s) of a set of one or more operational parameters associated with a current configuration setting of main device 410 corresponding to the current operating frequency and/or operating voltage of main device 410. Each set of the one or more sets of registers 412(1)(1)-412(1)(P) through 412(X)(1)-412(X)(P) may be a set of registers that respectively stores values of a set of one or more operational parameters associated with a respective future or past configuration setting of main device 410 corresponding to a respective future or past operating frequency and/or operating voltage of main device 410. Thus, first set of registers 414(1)-414(P) may be similar or analogous to first set of registers 112(1)(1)-112(1)(N), and each set of the one or more sets of registers 412(1)(1)-412(1)(P) through 412(X)(1)-412(X)(P) may be similar or analogous to any of second set of registers 112(2)(1)-112(2)(N) through $M^{th}$ set of registers 112(M)(1)-112(M)(N) in the example described above with respect to FIG. 1.

External component 420 may include a first set of registers 424(1)-424(Q) and one or more sets of registers 422(1)(1)-422(1)(Q) . . . up to an $Y^{th}$ set of registers 422(Y)(1)-422(Y)(Q) with each set having a quantity of Q registers, where Y is a positive integer greater than 1 and Q is a positive integer greater than or equal to 1. First set of registers 424(1)-424(Q) may be a designated set of registers that stores value(s) of a set of one or more operational parameters associated with a current configuration setting of external component 420 corresponding to the current operating frequency and/or operating voltage of external component 420. Each set of the one or more sets of registers 422(1)(1)-422(1)(Q) through 422(Y)(1)-422(Y)(Q) may be a set of registers that respectively stores values of a set of one or more operational parameters associated with a respective future or past configuration setting of external component 420 corresponding to a respective future or past operating frequency and/or operating voltage of external component 420. Thus, first set of registers 424(1)-424(Q) may be similar or analogous to first set of registers 112(1)(1)-112(1)(N), and each set of the one or more sets of registers 422(1)(1)-422(1)(Q) through 422(Y)(1)-422(Y)(Q) may be similar or analogous to any of second set of registers 112(2)(1)-112(2)(N) through $M^{th}$ set of registers 112(M)(1)-112(M)(N) in the example described above with respect to FIG. 1.

Similarly, external component 430 may include a first set of registers 434(1)-434(R) and one or more sets of registers 432(1)(1)-432(1)(R) . . . up to a $Z^{th}$ set of registers 432(Z)(1)-432(Z)(R) with each set having a quantity of R registers, where Z is a positive integer greater than 1 and R is a positive integer greater than or equal to 1. First set of registers 434(1)-434(R) may be a designated set of registers that stores value(s) of a set of one or more operational parameters associated with a current configuration setting of external component 430 corresponding to the current operating frequency and/or operating voltage of external component 430. Each set of the one or more sets of registers 432(1)(1)-432(1)(R) through 432(Z)(1)-432(Z)(R) may be a set of registers that respectively stores values of a set of one or more operational parameters associated with a respective future or past configuration setting of external component 430 corresponding to a respective future or past operating frequency and/or operating voltage of external component 430. Thus, first set of registers 434(1)-434(R) may be similar or analogous to first set of registers 112(1)(1)-112(1)(N), and each set of the one or more sets of registers 432(1)(1)-432(1)(R) through 432(Z)(1)-432(Z)(R) may be similar or analogous to any of second set of registers 112(2)(1)-112(2)(N) through $M^{th}$ set of registers 112(M)(1)-112(M)(N) in the example described above with respect to FIG. 1.

Main device 410 may further include a hardware setting change accelerator 416, which may be implemented as hardware, software or a combination of hardware and software. Hardware setting change accelerator 416 may be coupled to or at least capable of accessing the sets of registers 414(1)-414(P) and 412(1)(1)-412(1)(P) through 412(X)(1)-412(X)(P) of main device 410. Hardware setting change accelerator 416 may be also coupled to or at least capable of accessing the sets of registers 424(1)-424(Q) and 422(1)(1)-422(1)(Q) through 422(Y)(1)-422(Y)(Q) of external component 420. Moreover, hardware setting change accelerator 416 may be also coupled to or at least capable of accessing the sets of registers 434(1)-434(R) and 432(1)(1)-432(1)(R) through 432(Z)(1)-432(Z)(R) of external component 430.

Hardware setting change accelerator 416 may prepare for a change in configuration setting of each of main device 410 and external components 420 and 430 corresponding to a change in the operating frequency and/or operating voltage of main device 410 (or another device or component such as external component 420 or 430) in advance and prior to such change. This may be done by storing value(s) of one or more sets of one or more operational parameters associated with one or more possible configuration settings to which the current configuration setting of main device 410 (or another device or component such as external component 420 or 430) may change in one or more sets of registers (e.g., the one or more sets of registers 412(1)(1)-412(1)(P) through 412(X)(1)-412(X)(P) of main device 410, the one or more sets of registers 422(1)(1)-422(1)(Q) through 422(Y)(1)-422(Y)(Q) of external component 420, and the one or more sets of registers 432(1)(1)-432(1)(R) through 432(Z)(1)-432(Z)(R) of external component 430). Upon receiving an indication or upon a determination that the operating frequency and/or operating voltage of main device 410 (or another device or component such as external component 420 or 430) is to change from a current value to a next value, hardware setting change accelerator 416 may load, in a parallel fashion in one clock cycle, value(s) of the set of one or more operational parameters associated with the next configuration setting corresponding to the next value of the operating frequency and/or operating voltage into the designated set of registers that stores value(s) of the set of one or more operational parameters based on which each of main device 410 and external components 420 and 430 operates (e.g., registers 414(1)-414(P) of main device 410, registers 424(1)-424(Q) of external component 420 and registers 434(1)-434(R) of external component 430) from the pertinent set of registers among the one or more sets of registers 412(1)(1)-412(1)(P) through 412(X)(1)-412(X)(P) of main device 410, the one or more sets of registers 422(1)(1)-422(1)(Q) through 422(Y)(1)-422(Y)(Q) of external component 420, and the one or more sets of registers 432(1)(1)-432(1)(R) through 432(Z)(1)-432(Z)(R) of external component 430. A detailed description of operations of hardware setting change accelerator 416 is provided below with respect to example process 600 of FIG. 6.

Figure 5:
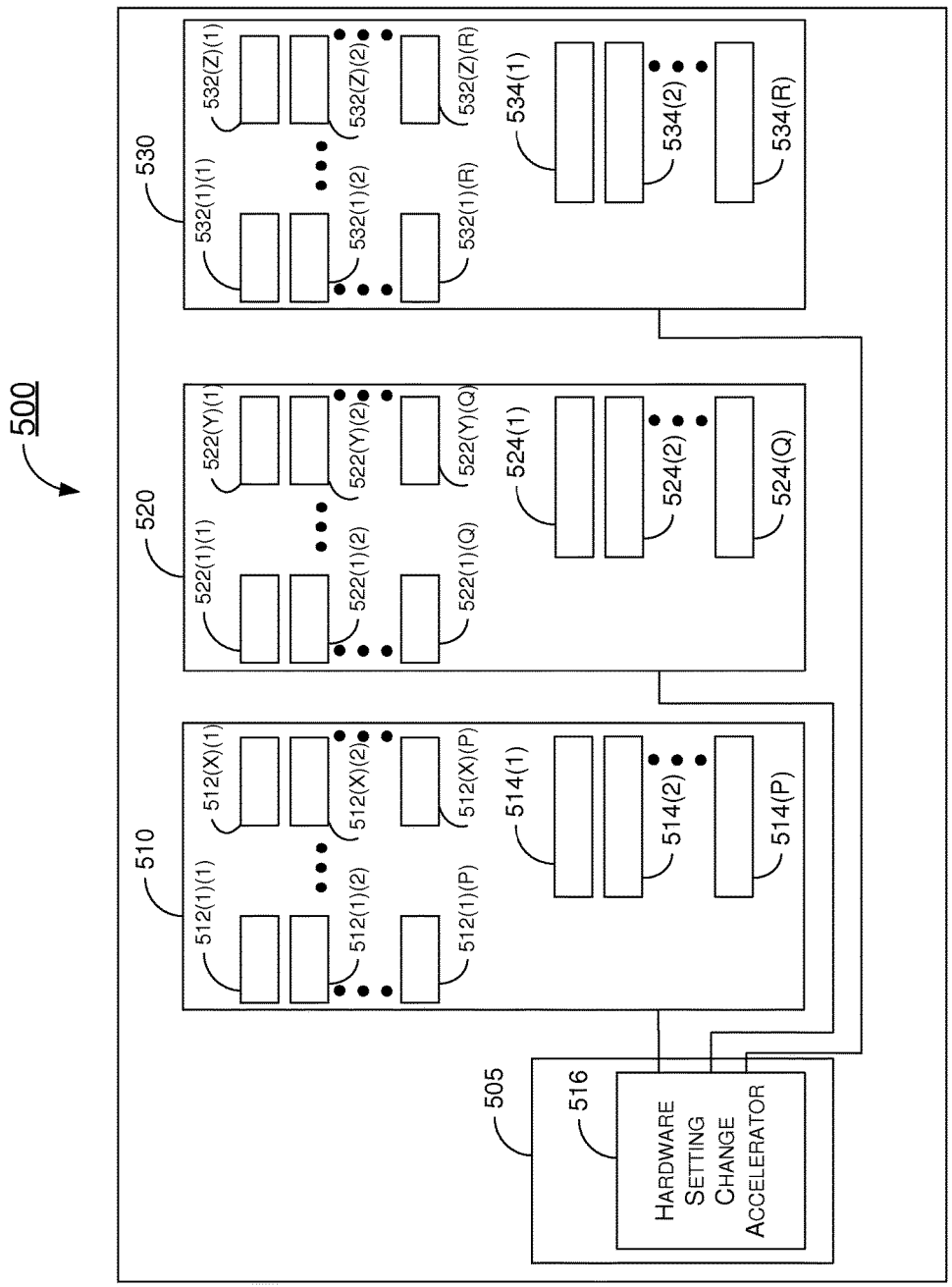
FIG. 5 is a block diagram of an example apparatus in accordance with another implementations of the present disclosure.

FIG. 5 illustrates an example apparatus 500 in accordance with another implementations of the present disclosure. Example apparatus 500 may perform various functions related to techniques, methods and systems described herein, including example scheme 100 described above and example process 600 described below. Example apparatus 500 may be an illustrative implementation of example scheme 100.

Example apparatus 500 may include a number of hardware components. Each hardware component may be form of one or more electronic circuits each respectively including physical elements such as one or more transistors, one or more capacitors, one or more diodes, one or more resistors, one or more inductors and/or one or more memristors. Moreover, one or more of the hardware components of example apparatus 500 may be configured to execute one or more sets of instructions stored in the form of one or more firmware modules, one or more middleware modules and/or one or more software modules. In some implementations, the one or more firmware modules, one or more middleware modules and/or one or more software modules may be embedded or otherwise stored in one or more of the hardware components of example apparatus 500. Additionally or alternatively, the one or more firmware modules, one or more middleware modules and/or one or more software modules may be stored in one or more external memory or data storage devices. Example apparatus 500 may be an IC chip, a chip set or an electronic apparatus. In some implementations, example apparatus 500 may be a portable electronics apparatus such as, for example and not limited to, a smartphone, a tablet computer, a laptop computer, a notebook computer, a wearable device and the like.

Example apparatus 500 may include at least those components shown in FIG. 5, such as a main device 505 and one or more external components 510, 520 and 530. Different from example apparatus 400, in example apparatus 500 main device 505 may include a hardware setting change accelerator 516 but no register(s) having value(s) of changed by hardware setting change accelerator 516. That is, in example apparatus 500, the registers the values of which are changed by hardware setting change accelerator 516 are in external components external to main device 505 in which hardware setting change accelerator 516 is located. Although three external components are shown in FIG. 5 (e.g., external component 510, external component 520 and external component 530), the quantity of external components may be different (e.g., less or greater) in various implementations. In some implementations, main device 505 may be a processor chip, and at least one of external components 510, 520 and 530 may be a memory chip such as, for example, a type of a DRAM, a SRAM or a flash memory.

External component 510 may include a first set of registers 514(1)-514(P) and one or more sets of registers 512(1)(1)-512(1)(P) . . . up to an $X^{th}$ set of registers 512(Y)(1)-512(X)(P) with each set having a quantity of P registers, where X is a positive integer greater than 1 and P is a positive integer greater than or equal to 1. First set of registers 514(1)-514(P) may be a designated set of registers that stores value(s) of a set of one or more operational parameters associated with a current configuration setting of external component 510 corresponding to the current operating frequency and/or operating voltage of external component 510. Each set of the one or more sets of registers 512(1)(1)-512(1)(P) through 512(X)(1)-512(X)(P) may be a set of registers that respectively stores values of a set of one or more operational parameters associated with a respective future or past configuration setting of external component 510 corresponding to a respective future or past operating frequency and/or operating voltage of external component 510. Thus, first set of registers 514(1)-514(P) may be similar or analogous to first set of registers 112(1)(1)-112(1)(N), and each set of the one or more sets of registers 512(1)(1)-512(1)(P) through 512(X)(1)-512(X)(P) may be similar or analogous to any of second set of registers 112(2)(1)-112(2)(N) through $M^{th}$ set of registers 112(M)(1)-112(M)(N) in the example described above with respect to FIG. 1.

External component 520 may include a first set of registers 524(1)-524(Q) and one or more sets of registers 522(1)(1)-522(1)(Q) . . . up to an $Y^{th}$ set of registers 522(Y)(1)-522(Y)(Q) with each set having a quantity of Q registers, where Y is a positive integer greater than 1 and Q is a positive integer greater than or equal to 1. First set of registers 524(1)-524(Q) may be a designated set of registers that stores value(s) of a set of one or more operational parameters associated with a current configuration setting of external component 520 corresponding to the current operating frequency and/or operating voltage of external component 520. Each set of the one or more sets of registers 522(1)(1)-522(1)(Q) through 522(Y)(1)-522(Y)(Q) may be a set of registers that respectively stores values of a set of one or more operational parameters associated with a respective future or past configuration setting of external component 520 corresponding to a respective future or past operating frequency and/or operating voltage of external component 520. Thus, first set of registers 524(1)-524(Q)

may be similar or analogous to first set of registers 112(1)(1)-112(1)(N), and each set of the one or more sets of registers 522(1)(1)-522(1)(Q) through 522(Y)(1)-522(Y)(Q) may be similar or analogous to any of second set of registers 112(2)(1)-112(2)(N) through $M^{th}$ set of registers 112(M)(1)-112(M)(N) in the example described above with respect to FIG. 1.

Likewise, external component 530 may include a first set of registers 534(1)-534(R) and one or more sets of registers 532(1)(1)-532(1)(R) . . . up to a $Z^{th}$ set of registers 532(Z)(1)-532(Z)(R) with each set having a quantity of R registers, where Z is a positive integer greater than 1 and R is a positive integer greater than or equal to 1. First set of registers 534(1)-534(R) may be a designated set of registers that stores value(s) of a set of one or more operational parameters associated with a current configuration setting of external component 530 corresponding to the current operating frequency and/or operating voltage of external component 530. Each set of the one or more sets of registers 532(1)(1)-532(1)(R) through 532(Z)(1)-532(Z)(R) may be a set of registers that respectively stores values of a set of one or more operational parameters associated with a respective future or past configuration setting of external component 530 corresponding to a respective future or past operating frequency and/or operating voltage of external component 530. Thus, first set of registers 534(1)-534(R) may be similar or analogous to first set of registers 112(1)(1)-112(1)(N), and each set of the one or more sets of registers 532(1)(1)-532(1)(R) through 532(Z)(1)-532(Z)(R) may be similar or analogous to any of second set of registers 112(2)(1)-112(2)(N) through $M^{th}$ set of registers 112(M)(1)-112(M)(N) in the example described above with respect to FIG. 1.

Hardware setting change accelerator 516, which may be implemented as hardware, software or a combination of hardware and software. Hardware setting change accelerator 516 may be coupled to or at least capable of accessing the sets of registers 514(1)-514(P) and 512(1)(1)-512(1)(P) through 512(X)(1)-512(X)(P) of external component 510. Hardware setting change accelerator 516 may be also coupled to or at least capable of accessing the sets of registers 524(1)-524(Q) and 522(1)(1)-522(1)(Q) through 522(Y)(1)-522(Y)(Q) of external component 520. Moreover, hardware setting change accelerator 516 may be also coupled to or at least capable of accessing the sets of registers 534(1)-534(R) and 532(1)(1)-532(1)(R) through 532(Z)(1)-532(Z)(R) of external component 530.

Hardware setting change accelerator 516 may prepare for a change in configuration setting of each of external component 510, 520 and 530 corresponding to a change in the operating frequency and/or operating voltage of external component 510 (or external component 520 or 530) in advance and prior to such change. This may be done by storing value(s) of one or more sets of one or more operational parameters associated with one or more possible configuration settings to which the current configuration setting of external component 510 (or external component 520 or 530) may change in one or more sets of registers (e.g., the one or more sets of registers 512(1)(1)-512(1)(P) through 512(X)(1)-512(X)(P) of external component 510, the one or more sets of registers 522(1)(1)-522(1)(Q) through 522(Y)(1)-522(Y)(Q) of external component 520, and the one or more sets of registers 532(1)(1)-532(1)(R) through 532(Z)(1)-532(Z)(R) of external component 530). Upon receiving an indication or upon a determination that the operating frequency and/or operating voltage of external component 510 (or external component 520 or 530) is to change from a current value to a next value, hardware setting change accelerator 516 may load, in a parallel fashion in one clock cycle, value(s) of the set of one or more operational parameters associated with the next configuration setting corresponding to the next value of the operating frequency and/or operating voltage into the designated set of registers that stores value(s) of the set of one or more operational parameters based on which each of external component 510, 520 and 5300 operates (e.g., registers 514(1)-514(P) of external component 510, registers 524(1)-524(Q) of external component 520 and registers 534(1)-534(R) of external component 530) from the pertinent set of registers among the one or more sets of registers 512(1)(1)-512(1)(P) through 512(X)(1)-512(X)(P) of external component 510, the one or more sets of registers 522(1)(1)-522(1)(Q) through 522(Y)(1)-522(Y)(Q) of external component 520, and the one or more sets of registers 532(1)(1)-532(1)(R) through 532(Z)(1)-532(Z)(R) of external component 530. A detailed description of operations of hardware setting change accelerator 516 is provided below with respect to example process 600 of FIG. 6.

Figure 6:
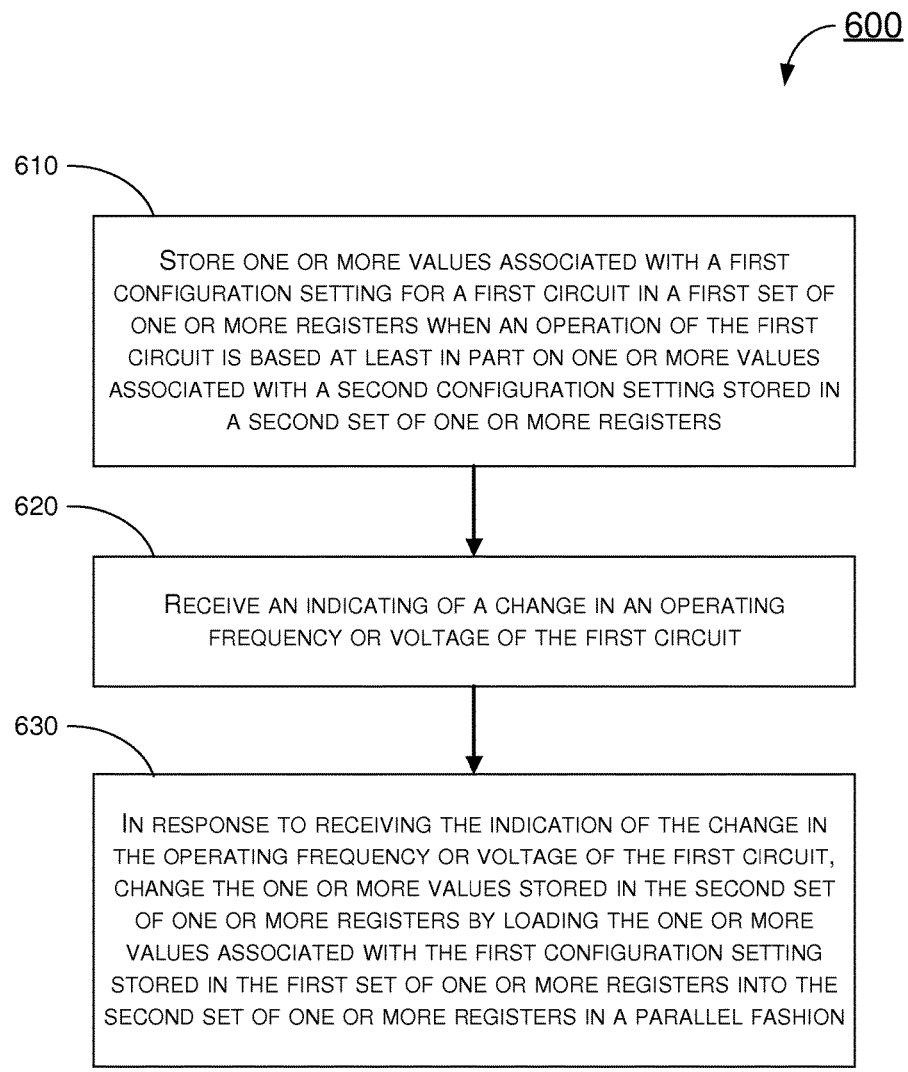
FIG. 6 is a flowchart of an example process in accordance with an implementation of the present disclosure.

FIG. 6 is a flowchart of an example process 600 in accordance with another implementation of the present disclosure. Example process 600 may include one or more operations, actions, or functions as represented by one or more of blocks 610, 620 and 630. Although illustrated as discrete blocks, various blocks may be divided into additional blocks, combined into fewer blocks, or eliminated, depending on the desired implementation. Example process 600 may be implemented by hardware setting change accelerator 116 of example scheme 100, hardware setting change accelerator 416 of example apparatus 400 and hardware setting change accelerator 516 of example apparatus 500. For illustrative purposes, operations of example process 600 are described below in the context of being performed by hardware setting change accelerator 416 or 516 of example apparatus 400 or 500. Example process 600 may begin at block 610.

At 610, example process 600 may involve hardware setting change accelerator 416 or 516 storing one or more values associated with a first configuration setting for a first circuit (e.g., main device 410, external component 420, external component 430, external component 510, external component 520 or external component 530) in a first set of one or more registers when an operation of the first circuit is based at least in part on one or more values associated with a second configuration setting stored in a second set of one or more registers. The first and second configuration settings may correspond to a first set of one or more operational parameters and a second set of one or more operational parameters of the first circuit, respectively. Block 610 may be followed by block 620.

At 620, example process 600 may involve hardware setting change accelerator 416 or 516 receiving an indication of a change in an operating frequency or voltage of the first circuit. Block 620 may be followed by block 630.

At 630, example process 600 may involve hardware setting change accelerator 416 or 516, in response to receiving the indication of the change in the operating frequency or voltage of the first circuit, changing the one or more values stored in the second set of one or more registers by loading the one or more values associated with the first configuration setting stored in the first set of one or more registers into the second set of one or more registers in a parallel fashion. Example process 600 may involve hardware setting change accelerator 416 or 516 performing additional and/or alternative operations, as described below albeit not shown in FIG. 6.

In some implementations, in storing the one or more values associated with the first configuration setting for the first circuit in the first set of one or more registers, example process 600 may involve hardware setting change accelerator 416 or 516 loading the one or more values associated with the first configuration setting into the first set of one or more registers prior to the operation of the first circuit is based at least in part on the one or more values associated with the second configuration setting stored in the second set of one or more registers. Alternatively, in storing the one or more values associated with the first configuration setting for the first circuit in the first set of one or more registers, example process 600 may involve hardware setting change accelerator 416 or 516 loading the one or more values associated with the first configuration setting into the first set of one or more registers after the operation of the first circuit is based at least in part on the one or more values associated with the second configuration setting stored in the second set of one or more registers and prior to receiving the indication of the change in the operating frequency or voltage of the first circuit.

In some implementations, in storing the one or more values associated with the first configuration setting in the first set of one or more registers when the operation of the first circuit is based at least in part on the one or more values associated with the second configuration setting stored in the second set of one or more registers, example process 600 may involve hardware setting change accelerator 416 or 516 storing one or more values corresponding to a respective set of one or more operational parameters of a first plurality of sets of one or more operational parameters in a respective set of one or more registers of a first plurality sets of one or more registers. Each set of one or more operational parameters of the first plurality of sets of one or more operational parameters may correspond to a respective configuration setting of a first plurality of configuration settings under which the first circuit is configured to operate.

In some implementations, the first configuration setting or the second configuration setting may include at least one of a frequency and a voltage of the first circuit.

In some implementations, in changing the one or more values stored in the second set of one or more registers, example process 600 may involve hardware setting change accelerator 416 or 516 exchanging the one or more values stored in the first set of one or more registers and the one or more values stored in the second set of one or more registers such that, after the exchanging, the one or more values associated with the first configuration setting are stored in the second set of one or more registers and the one or more values associated with the second configuration setting are stored in the first set of one or more registers.

In some implementations, in receiving the indication of the change in the operating frequency or voltage of the first circuit, example process 600 may involve hardware setting change accelerator 416 or 516 receiving the indication of the change of the operating frequency or voltage of the first circuit when an operation of a second circuit is based at least in part on a third configuration setting having one or more corresponding values stored in a third set of one or more registers.

In some implementations, one of the first circuit and the second circuit may be on a main device and the other one of the first circuit and the second circuit may be on a component external to the main chip.

In some implementations, example process 600 may further involve hardware setting change accelerator 416 or 516 storing one or more values associated with a fourth configuration setting in a fourth set of one or more registers when the operation of the second circuit is based at least in part on the one or more values associated with the third configuration setting stored in the third set of one or more registers. Example process 600 may also involve hardware setting change accelerator 416 or 516, in response to receiving the indication of the change in the operating frequency or voltage of the first circuit, changing the one or more values stored in the third set of one or more registers by loading the one or more values associated with the fourth configuration setting stored in the fourth set of one or more registers into the third set of one or more registers in a parallel fashion.

In some implementations, in storing the one or more values associated with the fourth configuration setting in the fourth set of one or more registers, example process 600 may involve hardware setting change accelerator 416 or 516 loading the one or more values associated with the fourth configuration setting into the fourth set of one or more registers prior to the operation of the second circuit is based at least in part on the one or more values associated with the third configuration setting stored in the third set of one or more registers. Alternatively, in storing the one or more values associated with the fourth configuration setting in the fourth set of one or more registers, example process 600 may involve hardware setting change accelerator 416 or 516 loading the one or more values associated with the fourth configuration setting into the fourth set of one or more registers after the operation of the second circuit is based at least in part on the one or more values associated with the third configuration setting stored in the third set of one or more registers and prior to receiving the indication of the change in the operating frequency or voltage of the first circuit.

Additionally or alternatively, in storing the one or more values associated with the fourth configuration setting in the fourth set of one or more registers when the operation of the second circuit is based at least in part on the one or more values associated with the third configuration setting stored in the third set of one or more registers, example process 600 may involve hardware setting change accelerator 416 or 516 storing one or more values corresponding to a respective set of one or more operational parameters of a second plurality of sets of one or more operational parameters in a respective set of one or more registers of a second plurality sets of one or more registers. Each set of one or more operational parameters of the second plurality of sets of one or more operational parameters may correspond to a respective configuration setting of a second plurality of configuration settings under which the second circuit is configured to operate.

In some implementations, the third configuration setting or the fourth configuration setting may include at least one of a frequency and a voltage of the second circuit.

In some implementations, in changing the one or more values stored in the third set of one or more registers, example process 600 may involve hardware setting change accelerator 416 or 516 exchanging the one or more values stored in the fourth set of one or more registers and the one or more values stored in the third set of one or more registers such that, after the exchanging, the one or more values associated with the fourth configuration setting are stored in the third set of one or more registers and the one or more values associated with the third configuration setting are stored in the fourth set of one or more registers.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method implemented in an apparatus, comprising:
    storing, by a hardware setting change accelerator of the apparatus, one or more values associated with a first configuration setting for a first circuit of the apparatus in a first set of one or more registers of the apparatus when an operation of the first circuit is based at least in part on one or more values associated with a second configuration setting stored in a second set of one or more registers of the apparatus, wherein the first and second configuration settings correspond to a first set of one or more operational parameters and a second set of one or more operational parameters of the first circuit, respectively;
    receiving, by the hardware setting change accelerator, an indication of a change in an operating frequency or voltage of the first circuit; and
    in response to receiving the indication of the change in the operating frequency or voltage of the first circuit, changing, by the hardware setting change accelerator, the one or more values stored in the second set of one or more registers by loading the one or more values associated with the first configuration setting stored in the first set of one or more registers into the second set of one or more registers in a parallel fashion.

2. The method of claim 1, wherein the storing of the one or more values associated with the first configuration setting for the first circuit in the first set of one or more registers comprises loading the one or more values associated with the first configuration setting into the first set of one or more registers prior to the operation of the first circuit is based at least in part on the one or more values associated with the second configuration setting stored in the second set of one or more registers.

3. The method of claim 1, wherein the storing of the one or more values associated with the first configuration setting for the first circuit in the first set of one or more registers comprises loading the one or more values associated with the first configuration setting into the first set of one or more registers after the operation of the first circuit is based at least in part on the one or more values associated with the second configuration setting stored in the second set of one or more registers and prior to receiving the indication of the change in the operating frequency or voltage of the first circuit.

4. The method of claim 1, wherein the storing of the one or more values associated with the first configuration setting in the first set of one or more registers when the operation of the first circuit is based at least in part on the one or more values associated with the second configuration setting stored in the second set of one or more registers comprises:
    storing one or more values corresponding to a respective set of one or more operational parameters of a first plurality of sets of one or more operational parameters in a respective set of one or more registers of a first plurality sets of one or more registers,
    wherein each set of one or more operational parameters of the first plurality of sets of one or more operational parameters corresponds to a respective configuration setting of a first plurality of configuration settings under which the first circuit is configured to operate.

5. The method of claim 1, wherein the first configuration setting or the second configuration setting comprises at least one of a frequency and a voltage of the first circuit.

6. The method of claim 1, wherein the changing of the one or more values stored in the second set of one or more registers comprises exchanging the one or more values stored in the first set of one or more registers and the one or more values stored in the second set of one or more registers such that, after the exchanging, the one or more values associated with the first configuration setting are stored in the second set of one or more registers and the one or more values associated with the second configuration setting are stored in the first set of one or more registers.

7. The method of claim 1, wherein the receiving of the indication of the change in the operating frequency or voltage of the first circuit comprises receiving the indication of the change of the operating frequency or voltage of the first circuit when an operation of a second circuit is based at least in part on a third configuration setting having one or more corresponding values stored in a third set of one or more registers.

8. The method of claim 7, wherein one of the first circuit and the second circuit is on a main device and the other one of the first circuit and the second circuit is on a component external to the main chip.

9. The method of claim 7, further comprising:
    storing one or more values associated with a fourth configuration setting in a fourth set of one or more registers when the operation of the second circuit is based at least in part on the one or more values associated with the third configuration setting stored in the third set of one or more registers; and
    in response to receiving the indication of the change in the operating frequency or voltage of the first circuit, changing the one or more values stored in the third set of one or more registers by loading the one or more values associated with the fourth configuration setting stored in the fourth set of one or more registers into the third set of one or more registers in a parallel fashion.

10. The method of claim 9, wherein the storing of the one or more values associated with the fourth configuration setting in the fourth set of one or more registers comprises loading the one or more values associated with the fourth configuration setting into the fourth set of one or more registers prior to the operation of the second circuit is based at least in part on the one or more values associated with the third configuration setting stored in the third set of one or more registers.

11. The method of claim 9, wherein the storing of the one or more values associated with the fourth configuration setting in the fourth set of one or more registers comprises loading the one or more values associated with the fourth configuration setting into the fourth set of one or more registers after the operation of the second circuit is based at least in part on the one or more values associated with the third configuration setting stored in the third set of one or more registers and prior to receiving the indication of the change in the operating frequency or voltage of the first circuit.

12. The method of claim 9, wherein the storing of the one or more values associated with the fourth configuration setting in the fourth set of one or more registers when the operation of the second circuit is based at least in part on the one or more values associated with the third configuration setting stored in the third set of one or more registers comprises:
    storing one or more values corresponding to a respective set of one or more operational parameters of a second plurality of sets of one or more operational parameters in a respective set of one or more registers of a second plurality sets of one or more registers,
    wherein each set of one or more operational parameters of the second plurality of sets of one or more operational parameters corresponds to a respective configuration setting of a second plurality of configuration settings under which the second circuit is configured to operate.

13. The method of claim 9, wherein the third configuration setting or the fourth configuration setting comprises at least one of a frequency and a voltage of the second circuit.

14. The method of claim 9, wherein the changing of the one or more values stored in the third set of one or more registers comprises exchanging the one or more values stored in the fourth set of one or more registers and the one or more values stored in the third set of one or more registers such that, after the exchanging, the one or more values associated with the fourth configuration setting are stored in the third set of one or more registers and the one or more values associated with the third configuration setting are stored in the fourth set of one or more registers.

15. An apparatus, comprising:
    a first set of one or more registers;
    a second set of one or more registers;
    a first circuit coupled to the first set of one or more registers and the second set of one or more registers, the first circuit configured to operate based at least in part on one or more values corresponding to a first configuration setting when an operating frequency or voltage of the first circuit is set to a first value, the first circuit further configured to operate based at least in part on one or more values corresponding to a second configuration setting when the operating frequency or voltage of the first circuit is set to a second value, wherein the first and second configuration settings correspond to a first set of one or more operational parameters and a second set of one or more operational parameters of the first circuit, respectively; and
    a hardware setting change accelerator coupled to or capable of accessing the first set of one or more registers and the second set of one or more registers, the hardware setting change accelerator configured to store the one or more values associated with the first configuration setting for the first circuit in the first set of one or more registers when an operation of the first circuit is based at least in part on the one or more values associated with the second configuration setting stored in the second set of one or more registers, the hardware setting change accelerator also configured to receive an indication that the operating frequency or voltage of the first circuit is to change from the second value to the first value, the hardware setting change accelerator further configured to, in response to receiving the indication that the operating frequency or voltage of the first circuit is to change from the second value to the first value, change the one or more values stored in the second set of one or more registers by loading the one or more values associated with the first configuration setting stored in the first set of one or more registers into the second set of one or more registers in a parallel fashion.

16. The apparatus of claim 15, wherein, in storing the one or more values associated with the first configuration setting for the first circuit in the first set of one or more registers, the hardware setting change accelerator is configured to load the one or more values associated with the first configuration setting into the first set of one or more registers prior to the operation of the first circuit is based at least in part on the one or more values associated with the second configuration setting stored in the second set of one or more registers.

17. The apparatus of claim 15, wherein, in storing the one or more values associated with the first configuration setting for the first circuit in the first set of one or more registers, the hardware setting change accelerator is configured to load the one or more values associated with the first configuration setting into the first set of one or more registers after the operation of the first circuit is based at least in part on the one or more values associated with the second configuration setting stored in the second set of one or more registers and prior to receiving the indication of the change in the operating frequency or voltage of the first circuit.

18. The apparatus of claim 15, wherein, in storing the one or more values associated with the first configuration setting in the first set of one or more registers when the operation of the first circuit is based at least in part on the one or more values associated with the second configuration setting stored in the second set of one or more registers, the hardware setting change accelerator is configured to perform operations comprising:
storing one or more values corresponding to a respective set of one or more operational parameters of a first plurality of sets of one or more operational parameters in a respective set of one or more registers of a first plurality sets of one or more registers,
wherein each set of one or more operational parameters of the first plurality of sets of one or more operational parameters corresponds to a respective configuration setting of a first plurality of configuration settings under which the first circuit is configured to operate.

19. The apparatus of claim 15, wherein the first configuration setting or the second configuration setting comprises at least one of a frequency and a voltage of the first circuit.

20. The apparatus of claim 15, wherein, in changing the one or more values stored in the second set of one or more registers, the hardware setting change accelerator is configured to exchange the one or more values stored in the first set of one or more registers and the one or more values stored in the second set of one or more registers such that, after the exchanging, the one or more values associated with the first configuration setting are stored in the second set of one or more registers and the one or more values associated with the second configuration setting are stored in the first set of one or more registers.

21. The apparatus of claim 15, further comprising:
a third set of one or more registers coupled to or accessible by the hardware setting change accelerator;
a fourth set of one or more registers coupled to or accessible by the hardware setting change accelerator; and
a second circuit coupled to the third set of one or more registers and the fourth set of one or more registers, the second circuit configured to operate based at least in part on one or more values corresponding to a third configuration setting when an operating frequency or voltage of the second circuit is set to a third value, the second circuit further configured to operate based at least in part on one or more values corresponding to a fourth configuration setting when the operating frequency or voltage of the second circuit operates is set to a fourth value,
wherein the hardware setting change accelerator is configured to store the one or more values associated with the fourth configuration setting for the second circuit in the fourth set of one or more registers when an operation of the second circuit is based at least in part on the one or more values associated with the third configuration setting stored in the third set of one or more registers,
wherein the hardware setting change accelerator is also configured to receive an indication that the operating frequency or voltage of the second circuit is to change from the third value to the fourth value, and
wherein the hardware setting change accelerator is further configured to, in response to receiving the indication that the operating frequency or voltage of the second circuit is to change from the third value to the fourth value, change the one or more values stored in the third set of one or more registers by loading the one or more values associated with the fourth configuration setting stored in the fourth set of one or more registers into the third set of one or more registers in a parallel fashion.

22. The apparatus of claim 21, wherein, in storing the one or more values associated with the fourth configuration setting for the second circuit in the fourth set of one or more registers, the hardware setting change accelerator is configured to load the one or more values associated with the fourth configuration setting into the fourth set of one or more registers prior to the operation of the second circuit is based at least in part on the one or more values associated with the third configuration setting stored in the third set of one or more registers.

23. The apparatus of claim 21, wherein, in storing the one or more values associated with the fourth configuration setting for the second circuit in the fourth set of one or more registers, the hardware setting change accelerator is configured to load the one or more values associated with the fourth configuration setting into the fourth set of one or more registers after the operation of the second circuit is based at least in part on the one or more values associated with the third configuration setting stored in the third set of one or more registers and prior to receiving the indication of the change in the operating frequency or voltage of the second circuit.

24. The apparatus of claim 21, wherein, in storing the one or more values associated with the fourth configuration setting in the fourth set of one or more registers when the operation of the second circuit is based at least in part on the one or more values associated with the third configuration setting stored in the third set of one or more registers, the hardware setting change accelerator is configured to perform operations comprising:

storing one or more values corresponding to a respective set of one or more operational parameters of a second plurality of sets of one or more operational parameters in a respective set of one or more registers of a second plurality sets of one or more registers, wherein each set of one or more operational parameters of the second plurality of sets of one or more operational parameters corresponds to a respective configuration setting of a second plurality of configuration settings under which the second circuit is configured to operate.

25. The apparatus of claim 21, wherein the fourth configuration setting or the third configuration setting comprises at least one of a frequency and a voltage of the second circuit.

26. The apparatus of claim 21, wherein, in changing the one or more values stored in the third set of one or more registers, the hardware setting change accelerator is configured to exchange the one or more values stored in the fourth set of one or more registers and the one or more values stored in the third set of one or more registers such that, after the exchanging, the one or more values associated with the fourth configuration setting are stored in the third set of one or more registers and the one or more values associated with the third configuration setting are stored in the fourth set of one or more registers.

27. The apparatus of claim 21, further comprising:
a main device; and
an external component coupled to the main device,
wherein the main device comprises the first set of one or more registers, the second set of one or more registers, the first circuit, and the hardware setting change accelerator, and
wherein the external device comprises the third set of one or more registers, the fourth set of one or more registers, and the second circuit.

28. The apparatus of claim 27, wherein the main device comprises a processor chip, and wherein the external device comprises a memory chip.

* * * * *